United States Patent [19]

Hagner

[11] Patent Number: 4,893,216
[45] Date of Patent: Jan. 9, 1990

[54] CIRCUIT BOARD AND METHOD OF SOLDERING

[75] Inventor: George R. Hagner, Cary, N.C.

[73] Assignee: Northern Telecom Limited, Montreal, Canada

[21] Appl. No.: 230,147

[22] Filed: Aug. 9, 1988

[51] Int. Cl.⁴ .......................... H05K 13/04; H05K 3/34
[52] U.S. Cl. .................................... 361/406; 174/263; 228/180.2
[58] Field of Search ............... 174/68.5; 361/400, 403, 361/404, 406; 228/180.2

[56] References Cited

U.S. PATENT DOCUMENTS

| | | |
|---|---|---|
| 3,281,627 | 10/1966 | Fetterolf et al. . |
| 3,726,007 | 4/1973 | Keller . |
| 3,777,220 | 12/1973 | Tatusko et al. ................ 361/400 X |
| 3,934,336 | 1/1976 | Morse . |
| 4,139,881 | 2/1979 | Shimizu et al. . |
| 4,164,778 | 8/1979 | Sawairi et al. . |
| 4,326,239 | 4/1982 | Ohsawa et al. . |
| 4,339,785 | 7/1982 | Ohsawa . |
| 4,360,144 | 11/1982 | Cuddy et al. . |
| 4,361,862 | 11/1982 | Martyniak . |
| 4,372,475 | 2/1983 | Goforth et al. . |
| 4,373,259 | 2/1983 | Motsch . |
| 4,374,457 | 2/1983 | Wiech, Jr. . |
| 4,390,120 | 6/1983 | Broyer . |
| 4,413,309 | 11/1983 | Takahashi et al. . |
| 4,417,296 | 11/1983 | Schelhorn . |
| 4,437,141 | 3/1984 | Prokop ........................... 174/68.5 X |
| 4,547,836 | 10/1985 | Anthony ............................. 361/400 |
| 4,604,678 | 8/1986 | Hagner . |
| 4,604,799 | 8/1986 | Guroi ............................. 174/68.5 X |

Primary Examiner—Kenneth J. Ramsey
Attorney, Agent, or Firm—Foley & Lardner, Schwartz, Jeffery, Schwaab, Mack, Blumenthal & Evans

[57] ABSTRACT

Circuit boards that permit wave soldering of both leaded and surface mounted components to a common side. The circuit board carries plated grooves to provide interconnections between the components to be mounted to the board. For leaded components on the circuit board, holes are provided extending completely through the board, and the leaded components are mounted and soldered in a conventional fashion. For surface mounted (or leadless) components, small recesses or grooves are provided to accept the terminals of the components themselves. The grooves are plated with an electrically conductive material, and contain a hole that passes from the upper surface to the bottom surface of the circuit board. When the circuit board is wave soldered, in a conventional manner, solder from the wave soldering process engages the holes, passes through the holes to the upper surface of the circuit board, and then runs along the grooves in the upper surface of the circuit board. Upon solidifying, the solder provides an electrical connection between the components.

9 Claims, 3 Drawing Sheets

CIRCUIT BOARD AND METHOD OF SOLDERING

This invention relates generally to circuit boards (commonly referred to as printed circuit boards, PCBs), and more specifically to a molded circuit board to which both leaded components and surface mounted components can be mounted with a wave soldering process.

Techniques exist in the prior art for mounting surface mounted components to printed circuit boards. Many techniques also exist for mounting a combination of surface mounted components and leaded components to a common printed circuit board.

The technique referred to generally as wave soldering is well known and is described in more detail in the following patents: U.S. Pat. No. 4,390,120 dated June 28, 1983 to A. P. Broyer entitled "Soldering Methods and Apparatus"; and U.S. Pat. No. 4,360,144 dated Nov. 23, 1982 by W. A. Cuddy et al entitled "Printed Circuit Board Soldering", to which attention is directed.

The following patents refer generally to the mounting of a surface mounted component to a printed circuit board. Attention is directed thereto. U.S. Pat. No. 4,417,296 dated Nov. 22, 1983 to R. L. Schelhorn entitled "Method of Connecting Surface Mounted Packages to a Circuit Board and the Resulting Connector"; U.S. Pat. No. 4,373,259 dated Feb. 15, 1983 to H. Motsch entitled: "Process for Mounting Components with Surface Junctions to Printed-Circuit Boards"; U.S. Pat. No. 4,361,862 dated Nov. 30, 1982 by G. J. Martyniak entitled "Assemblies of Electrical Components with Printed Circuit Boards, and Printed Circuit Board Structures Therefor"; U.S. Pat. No. 4,372,475 dated Feb. 8, 1983 by M. L. Goforth et al entitled "Electronic Assembly Process and Apparatus"; U.S. Pat. No. 4,339,785 dated July 13, 1982 by M. Ohsawa entitled "Electronic Circuit Arrangement Mounted on Printed Circuit Board"; U.S. Pat. No. 4,326,239 dated Apr. 20, 1982 by M. Ohsawa et al entitled "Printed Circuit Board".

Techniques of soldering both surface mounted components (sometimes referred to as leadless components) and leaded components to printed circuit boards are found in the following U.S. patents to which attention is directed: U.S. Pat. No. 3,726,007 dated Apr. 10, 1973 by J. D. Keller entitled "Component Side Printed Circuit Soldering"; U.S. Pat. No. 4,139,881 dated Feb. 13, 1979 by T. Shimizu et al entitled "Circuit Board Assembly and Method of Manufacturing the Same"; U.S. Pat. No. 4,164,778 dated Aug. 14, 1979 to H. Sawairi et al entitled "Printed Circuit Board"; and U.S. Pat. No. 4,413,309 dated Nov. 1, 1983 to T. Takahashi et al entitled "Printed Circuit Board".

Also known in the art and relevant to this invention are molded circuit boards. Molded circuit boards may have grooves filled with an electrically conductive material to form traces between components. In other words, the traces are grooves carried by the surface of the circuit board to enable a higher packing density than would otherwise be possible. The depth of each trace or groove is a number of times greater than the width of the groove, a not untypical ratio being 10:1. The details of such circuit boards can be found in more detail, for example, in U.S. Pat. No. 4,604,678 dated Aug. 5, 1986 to George R. Hagner entitled "Circuit Board With High Density Electrical Tracers". Other patents describing grooves in circuit boards include U.S. Pat. No. 3,281,627 dated dated Oct. 25, 1966 by H. D. Fetterolf et al entitled "Circuit Board Connecting and Mounting Arrangement"; U.S. Pat. No. 3,934,336 dated Jan. 27, 1976 by R.S. Morse entitled "Electronic Package Assembly with Capillary Bridging Connection"; and U.S. Pat. No. 4,374,457 dated Feb. 22, 1983 by R. E. Wiech Jr. entitled "Method of Fabricating Complex Micro-Circuit Boards and Substrates".

SUMMARY OF THE INVENTION

The present invention is directed to a circuit board that enables the soldering of both surface mounted and leaded components to a common side of the circuit board by the use of known wave soldering techniques. In other words, no special preparation of the surface of the circuit board is required such as gluing of the surface mounted components. Additionally, no reflow soldering is required: the wave soldering step provides soldering for both the leaded components and the surface mounted components at the same time i.e. with only a single pass through a wave soldering machine.

For leaded components on the circuit board, holes are provided extending completely through the circuit board, and the leaded components are mounted and soldered in a conventional fashion. For surface mounted (or leadless) components, small recesses or grooves are provided to accept the terminals of the components themselves. Electrical interconnections between the components are facilitated by providing grooves in the surface of the circuit board running between the terminals of the components. The grooves themselves are plated with an electrically conductive material, and contain a hole that passes from the upper surface to the bottom surface of the circuit board. When the circuit board is wave soldered, in a conventional manner, solder form the wave soldering process engages the holes, passes through the holes to the upper surface of the circuit board, and then runs along the grooves in the upper surface of the circuit board. Upon solidifying, the solder provides an electrical connection between the components, as well as mechanically holding the surface mounted components in place.

Stated in other terms, the present invention is a ciruit board comprising: an electrically insulative substrate having first and second approximately parallel surfaces, at least one surface provided with a plurality of grooves; the substrate having a plurality of holes passing through the substrate between the first surface and the second surface such that at least one groove on the at least one surface mates with at least one hole.

Stated in yet other terms, the present invention is a circuit board comprising: an electrically insulating substrate having first and second approximately parllel surfaces, at least one surface provided with a plurality of grooves; the grooves being approximately fifteen thousandths of an inch deep and approximately seven thousandths of an inch wide; the substrate having a plurality of holes passing through the substrate between the first surface and the second surface such that at least one groove on the at least one surface mates with at least one hole; and the holes having a diameter of approximately thirty thousandths of an inch.

Stated in still other terms, the present invention is a pin grid array adapter (PGAA) comprising: an electrically insulating substrate having first and second approximately parallel surfaces, at least the first surface provided with a plurality of grooves; the grooves terminating at a first end in a pad area comprised of a widened groove, and terminating at a second end in a hole passing between the first and second surfaces.

Stated in yet other terms, the present invention is a method of wave soldering a surface mounted component to a circuit board which has conductive grooves on a first surface and holes passing from the grooves to a second surface, the method comprising the steps of: (a) positioning the surface mounted component on the first surface such that terminals of the component mate with respective grooves on the board; (b) passing the circuit board through a wave of solder such that the wave of solder contacts the second surface of the circuit board and such that some solder from the wave engages at least some of the holes, moves through the holes and along at least some of the grooves to the terminals of the component; and removing the circuit board from the solder and allowing it to cool.

BRIEF DESCRIPTION OF THE DRAWINGS

The present invention will now be described in more detail with reference to the accompanying drawings, wherein like parts in each of the several figures are identified by the same reference character, and wherein.

DETAILED DESCRIPTION

Figure 1:
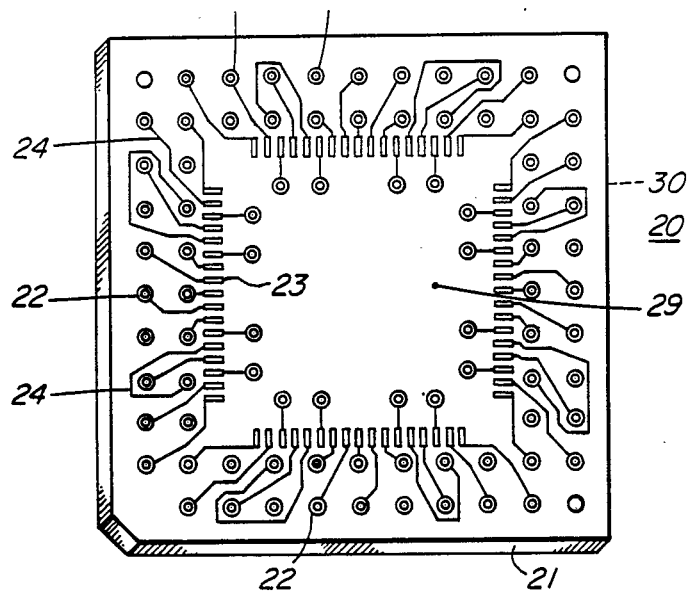
FIG. 1 is a simplified perspective view of a typical circuit board constructed according to the teachings of the present invention.
Figure 2:
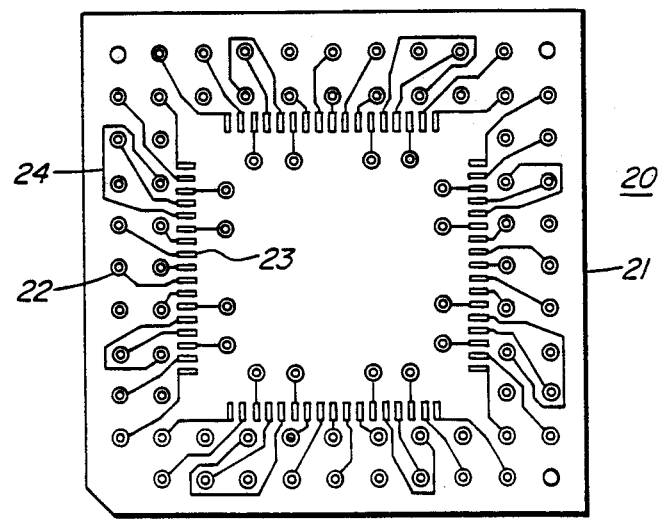
FIG. 2 is a simplified plan view of the circuit board of FIG. 1.

FIG. 1 depicts a circuit board 20, constructed according to the teachings of the present invention, prior to the step of soldering. Circuit board 20 is comprised of a planar plastic insulating material 21 (e.g. Polyethersulfone). Circuit board 20 has holes 22 which pass completely through circuit board 20, from the upper surface 29 to the lower surface 30, and has recesses 23 into which contacts from the surface mounted components will mate. Circuit board 20 also has grooves 24 connecting the holes 22 to the recesses 23.

Circuit board 20 can be manufactured by various methods, for example by injection molding, by embossing, or by impressing. In the exemplary embodiment of FIG. 1, the grooves 24 (or tracks) are approximately 15 mils deep; the recesses 23 (or pads) are approximately 20 mils wide by 50 mils long and are approximately 15 mils deep; and the tracks or grooves 24 are approximately 7 mils wide (in short, the pads 23 are widened grooves 24). This results in a preferred aspect ratio (depth to width) of approximately 2:1. After the circuit board 20 has been formed it is then plated. It is plated first with a layer of copper, approximately 1 mil thick, followed by a plating of tin, which is approximately 40 microns thick. Before plating, the raised portions of circuit board 20 (i.e. all but the grooves 24, pads 23, and holes 22) are coated with a plating resist to ensure that only the recessed portions are plated and that the raised portions are not plated. In short, grooves 24, pads 23, and holes 22 (including portions 27a, 27b, and 28 see FIG. 5) are plated with both copper and tin; upper surface 29 and lower surface 30 are not plated due to the presence of the plating resist (not shown).

Figure 3:
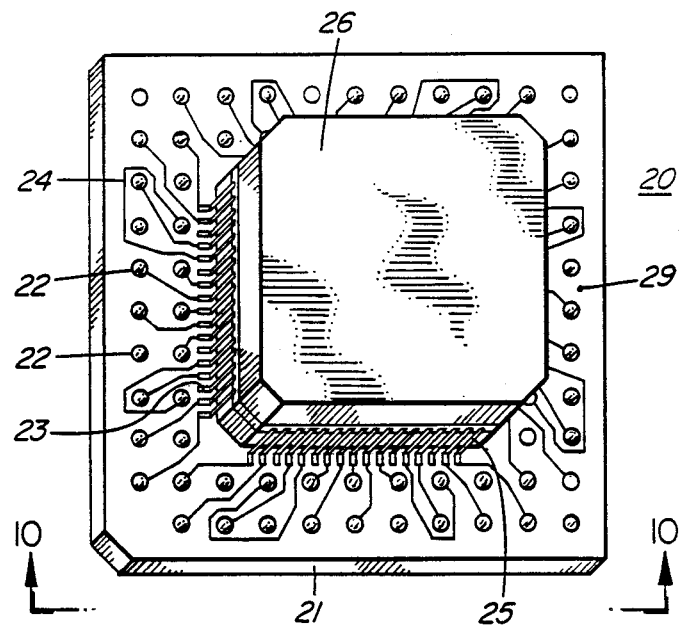
FIG. 3 is the same as FIG. 1 but shows, additionally, a component soldered into place.

FIG. 3 depicts circuit board 20 along with an integrated circuit 26 soldered in place to the upper surface 29 of circuit board 20. It will be noted that the leads 25 of integrated circuit 26 each mate with a pad or recess 23 on circuit board 20.

Figure 4:
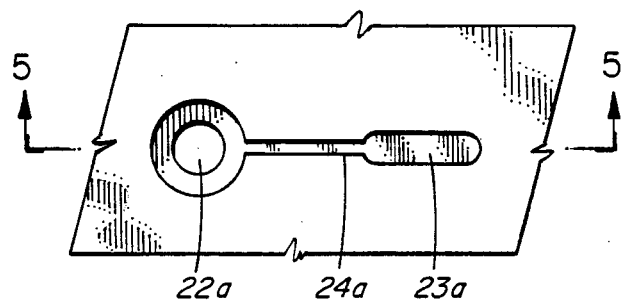
FIG. 4 is a simplified enlarged plan view of one of the traces from FIG. 3.
Figure 5:
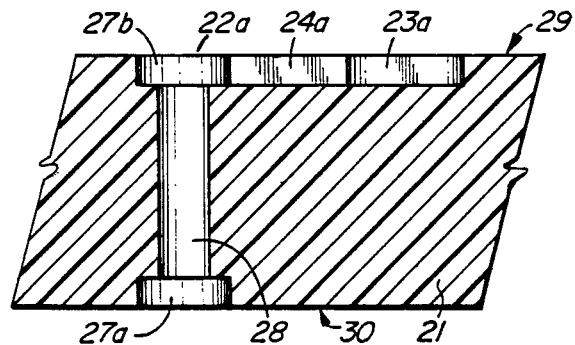
FIG. 5 is a sectional view of FIG. 4 taken through the section lines 5—5.

FIG. 4 depicts, in more detail, a typical recess or pad 23a, a typical hole 22a and the groove or track 24a interconnecting the two. This is shown in even more detail in FIG. 5 which is a cross-section of the FIG. 4 view. In FIG. 5, the hole 22a can be seen in more detail; it comprises a narrow internal portion 28 as well as an enlarged portion 27a at one end, and 27b at the other. Pad 23a is also shown as is the connecting track or groove 24a, interconnecting hole 22a with pad 23a.

When the soldering process occurs, the solder will be supplied to the underside surface 30 of circuit board 20 in the FIG. 5 view, i.e. it will be applied against portion 27a. The solder flows up through the narrow portion 28, to the enlarged portion 27b, and then moves along track 24a to the pad 23a (This is believed to be due to capillary action). When the soldering step is completed, the solder of course cools and solidifies in the areas 27a, 28, 27b, 24a and 23a, thus completing the solder connection of the component to circuit board 20.

Figure 7:
FIG. 7 is a plan view of FIG. 6 taken through the section line 7—7.
Figure 6:
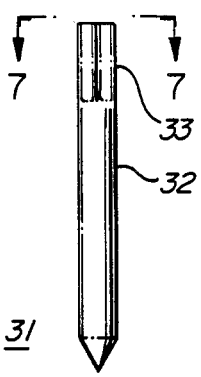
FIG. 6 is a simplified plan view, in elevation, of a pin used in conjunction with the circuit board of the present invention.

FIG. 6 depicts a pin 31 useful in the present invention. The pin comprises a generally cylindrical portion 32, as well as a "necked down" portion 33. The pin is also shown in FIG. 7, to which attention is also directed. With a pin of this nature mounted to the circuit board 20, when the soldering step occurs, solder can flow beside the necked down portion 33, thereby enabling solder to pass through a hole 22 containing a pin 31.

Figure 8:
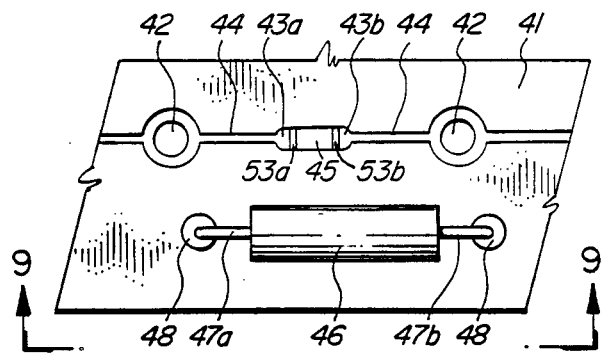
FIG. 8 is a simplified plan view of a small portion of the upper surface of a circuit board constructed according to the present invention, showing both a leaded component and a surface mounted component.

FIG. 8 depicts a simplified view of an enlarged portion of a circuit board 41 showing mounted thereto, a leaded component 46 (e.g. a resistor) and a surface mounted component 45 (e.g. a resistor). In reference to the surface mounted component 45, it will be seen that there are recesses 43a and 43b on either side of the component 45, as well as tracks 44 and holes 42. During the soldering step, solder moves up through the holes 42, follows along the tracks 44 and makes contact with the terminals 53a and 53b, of component 45. Once the soldering process is finished (i.e. the circuit board is removed from the solder and allowed to cool), the solder solidifies in those areas, thereby mechanically holding the surface mounted component in position as well as providing an electrical connection. Standard wave soldering processes happen with leaded component 46 having lead 47a inserted into hole 48, and a lead 47b inserted into another hole 48, as is shown in the Figure. The electrical interconnection of component 46 to the circuit is via tracks 44 (not shown) on the underside of circuit board 41.

Figure 9:
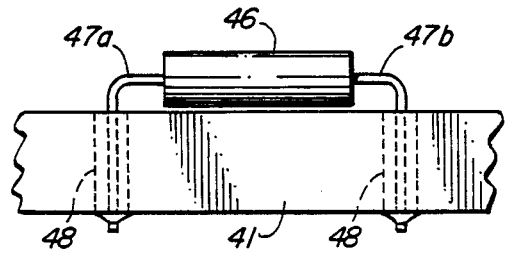
FIG. 9 is a sectional view of FIG. 8.

FIG. 9 is a sectional view of FIG. 8 showing the component 46, mounted to circuit board 41, in more detail.

Figure 10:
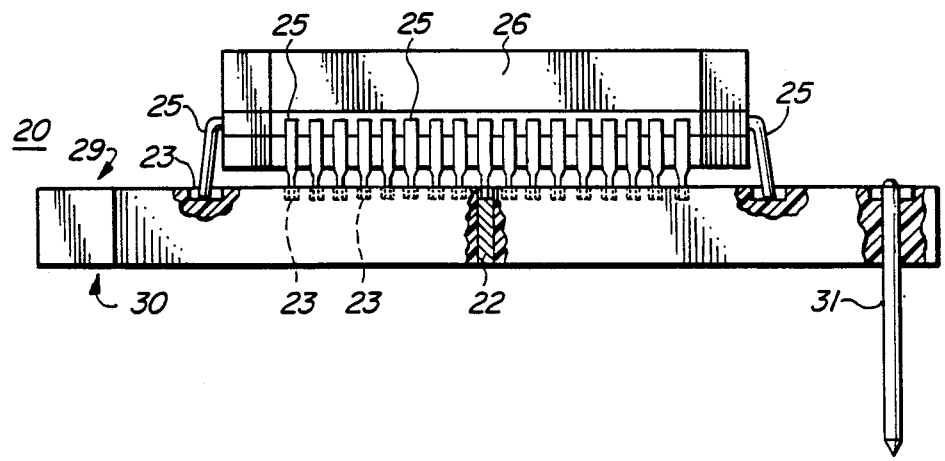
FIG. 10 is a side elevational view of FIG. 3 with some sections shown cut away.

FIG. 10 is a side elevational view of FIG. 3 with some sections shown cut away. FIG. 10 depicts circuit board 20, with integrated circuit 26 placed in position, on upper surface 29, just prior to the soldering step. Only one pin 31 is depicted in FIG. 10 so as not to obfuscate the figure. One implementation constructed by the inventors comprises a circuit board 20 (approximately 1 and ⅛ inches square) carrying a single integrated circuit 26. In that embodiment, circuit board 20 carries sixty-eight pins 31 and integrated circuit 26 has sixty-eight leads 25.

In other words, circuit board 20 carries one pin 31 for each lead 25 of integrated circuit 26. Such an arrangement makes it easier to connect an integrated circuit to other equipment. The packaging of an integrated circuit is quite compact with the leads close together and (in this instance) spaced along the four sides of the integrated circuit (IC). By mounting the integrated circuit to a relatively small circuit board, the total assembly (circuit board and IC) becomes larger and more manageable; also, the output pins can be spaced further apart and can be placed into a different arrangement. A device of this nature is referred to, in the industry, as a Pin Grid Array Adaptor (PGAA).

While a preferred embodiment of the invention has been disclosed, it is believed that the following variations thereof will function. The aspect ratio of 2:1 for the size of the grooves 24 can be greater; it is believed that it can be as much as 10:1 or higher. It is believed that holes 22 can be from approximately 20 to 45 thousandths of an inch in diameter. It is believed that the tin plating can be from approximately 20 to 40 m microns thick, and the copper plating can be a minimum of 0.75 mils thick. It is believed that grooves 24 can be 15 thousandths of an inch deep ± approximately 2 thousandths of an inch; and grooves 24 can be 7 thousandths of an inch wide ± approximately 1 thousandth of an inch.

What is claimed is:

1. A pin grid array adapter (PGAA) comprising:
   an electrically insulating substrate having first and second approximately parallel surfaces, at least said first surface provided with a plurality of grooves;
   said grooves terminating at a first end in a pad area comprised of a widened groove, and terminating at a second end in a hole passing between said first and second surfaces;
   electrically conductive pins in at least some of said holes, said pins protruding from said second surface;
   an integrated circuit soldered to said first surface, with solder approximately filling said grooves, and solder sealing said holes having said pins.

2. A circuit board comprising:
   an electrically insulating substrate having first and second approximately parallel surfaces, at least one said surface provided with a plurality of grooves;
   said grooves being approximately fifteen thousandths of an inch deep and approximately seven thousandths of an inch wide;
   said substrate having a plurality of holes passing through said substrate between said first surface and said second surface such that at least one said groove on said at least one said surface mates with at least one said hole;
   said holes having a diameter of approximately thirty thousandths of an inch;
   said grooves carrying electrically conductive material; and
   said grooves being filled approximately completely with solder.

3. The circuit board of claim 2 wherein said electrically conductive material is a layer of copper material coated with a layer of tin material.

4. The circuit board of claim 3 wherein said copper material is approximately one thousandth of an inch or more thick and said tin material is approximately 30 microns thick.

5. The circuit board of claim 4, wherein each said groove has at least one hole associated therewith.

6. The circuit board of claim 5 wherein said board is constructed of molded material.

7. The circuit board of claim 3 wherein each said groove has at least one hole associated therewith.

8. The circuit board of claim 6 or 4 wherein said grooves additionally carry solder.

9. A method of wave soldering a surface mounted component to a circuit board which has conductive grooves on a first surface and holes passing from said grooves to a second surface, said method comprising the steps of:
   (a) positioning said surface mounted component on said first surface such that terminals of said component mate with respective grooves on said board;
   (b) passing said circuit board through a wave of solder such that said wave of solder contacts said second surface of said circuit board and such that some solder from said wave engages at least some of said holes, moves through said holes and along at least some of said grooves to said terminals of said component; and
   (c) removing said circuit board from said solder and allowing it to cool.

* * * * *